United States Patent [19]
Keeler et al.
[11] 3,803,828
[45] Apr. 16, 1974

[54] RESISTOR TRIM FOR QUARTZ OSCILLATOR

[75] Inventors: Eugene R. Keeler, Suffern, N.Y.; Robert C. Shapiro, Pompton Plains, N.J.

[73] Assignee: Timex Corporation, Waterbury, Conn.

[22] Filed: Oct. 12, 1972

[21] Appl. No.: 297,151

[52] U.S. Cl. .............................. 58/23 AC, 331/176
[51] Int. Cl. .............................. G04c 3/00
[58] Field of Search ....... 58/23 R, 23 A, 23 AO, 34, 58/50 R, 85.5; 331/110, 117, 176

[56] References Cited

UNITED STATES PATENTS

| | | | |
|---|---|---|---|
| 2,976,470 | 3/1961 | Krassdievitch | 58/23 B |
| 2,788,449 | 4/1957 | Bright | 58/23 AC |
| 2,643,418 | 2/1972 | Polin et al. | 58/85.5 |
| 3,564,837 | 2/1971 | Keeler et al. | 58/23 A |
| 3,664,118 | 5/1972 | Walton | 58/23 A X |
| 3,530,662 | 9/1970 | Schöninger | 58/28 R X |
| 3,360,746 | 12/1967 | Weidknecht | 331/176 X |

*Primary Examiner*—Richard B. Wilkinson
*Assistant Examiner*—Edith Simmons Jackmon

[57] ABSTRACT

This invention relates to a trimming arrangement for a quartz oscillator particularly suited for use in highly accurate quartz watches, wherein the oscillator output frequency is adjusted to a predetermined precise frequency by varying the resistance within the trimming arrangement. The variable resistor is deposited on a substrate eliminating the need for mounting a separate element as in conventional capacitor trimming circuits.

2 Claims, 5 Drawing Figures

RESISTOR TRIM FOR QUARTZ OSCILLATOR

BACKGROUND OF THE INVENTION

The present invention relates to a means for trimming the output frequency of a quartz oscillator to a precise frequency.

In quartz oscillators, the quartz crystal may be cut under normal manufacturing procedures to an accuracy of a ±1Hz which is satisfactory for many purposes. However, in applications such as quartz watches, it is essential that the quartz oscillator output frequency be a predetermined frequency to permit accurate timekeeping. For example, in one commercial quartz watch the oscillator frequency is specified as 49,152 Hz and a variation of 1Hz would result in unacceptable variation of 2 seconds per day in the watch.

The conventional method of trimming quartz oscillators involved the use of a variable capacitor typically incorporated in a Pierce oscillator arrangement. However, this type of trimming requires a separate variable capacitive element which must be mounted on a substrate. The present invention proposes a more reliable trimming element such as a variable resistor which may be deposited on a substrate. Since an added assembly operation is not required and the element is less expensive, a significant cost savings can be achieved while circuit reliability is improved.

The prior art includes Zemla U.S. Pat. No. 3,046,460; Wiley U.S. Pat. No. 3,306,030; Nakai U.S. Pat. No. 3,469,389; Shelly U.S. Pat. No. 3,430,119 and Yoshimara U.S. Pat. No. 3,566,600. These patents are mentioned as being representative of the prior art and other pertinent patents may exist. None of the above cited patents are deemed to affect the patentability of the present invention.

SUMMARY OF THE INVENTION

As distinguished from the prior art this invention relates to a unique means from precisely trimming the output frequency of a quartz oscillator. In one embodiment of the Pierce oscillator type, a variable resistor is inserted in series with a first capacitor in a tank circuit comprising a quartz crystal and the first capacitor and a second capacitor. The phase shifted feedback signal is thus determined by the combination of the first capacitor and the variable resistor which causes a corresponding change in the oscillating frequency of the system. The invention is, of course, not limited to bipolar Pierce type circuits and, hence, other embodiments include a complimentary MOS equivalent of the bipolar Pierce type circuit, a modified Colpitts circuit or a modified Hartley oscillator.

Accordingly, it is an object of this invention to provided a new and improved trimming arrangement for a quarts oscillator.

Another object of this invention is to provide a unique resistor trimming arrangement for a quartz oscillator which may be mounted directly on a substrate.

A more specific object of this invention is to provide a new and improved trimming arrangement for a quartz oscillator, primarily for use in timepiece, wherein a variable resistor is employed to precisely trim the output frequency of the oscillator resulting in a substantial cost savings.

BRIEF DESCRIPTION OF THE DRAWINGS

Other objects and advantages of the present invention may be more clearly seen when viewed in conjunction with the accompanying drawings wherein.

DETAILED DESCRIPTION OF THE INVENTION

Figure 1:
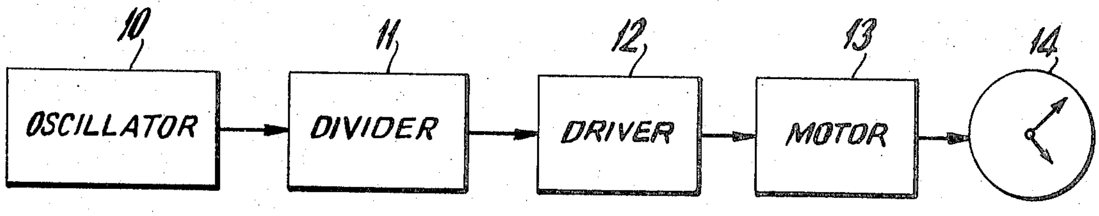
FIG. 1 is a block diagram of a typical quartz watch arrangement wherein the present invention may be used to precisely determine the frequency of the oscillator.

FIG. 1 of the drawings discloses a block diagram arrangement for a typical quartz watch. The watch includes a high frequency quartz oscillator 10, a divider 11 which reduces the oscillator output frequency to a driver 12 and a motor 13 which is driven thereby. The motor 13 drives the watch mechanism indicated schematically as 14.

According to the present invention, the oscillator 10 includes a quartz crystal 16 having a natural frequency in the 50 KHz range connected across the collector-base circuit of a transistor 17. The circuit also includes capacitors 18 and 19 connected in a tank circuit with the quartz crystal 16. A variable resistor 21 is connected in series with capacitor 18 while a fixed resistor 22 is connected across the crystal 16. Power is supplied over line 23 and resistor 24 from a power supply such as a conventional watch battery (not shown).

The circuit operation of the prior art may be explained with reference to FIG. 2 by shorting Resistor 21 and by assuming a voltage e at point A and a lossless tank circuit comprising the quartz crystal 16 and capacitors 18 and 19. Since the common connection of capacitors 18 and 19 is grounded and the current though the capacitors 18 and 19 is the same, the tank circuit produces an output voltage of $-e$ at point B. Thus, the tank circuit has a phase shift of 180° referred to ground. The additional 180° phase shift in transistor 17 completes the loop with a 360° phase shift to permit oscillations if the gain of the transistor is sufficiently high.

Typical values of the components for operation and 50 KHz are as follows:

Resistor 24 = 150 Kohms

Resistor 22 = 2.2 Megohms

Capacitor 18 = Capacitor 19 = 33 pf.

A small change in output frequency can be effected by this circuit by varying the capacitors 18 or 19 or by varying both capacitors 18 and 19 which, of course, changes the oscillating frequency of the tank circuit. Indeed, this technique is commonly employed in the prior art but has serious disadvantages when applied to watch circuits. Using a variable capacitor to trim the quartz oscillator requires a separate capacitive element which must be mounted on a substrate. This involves additional component and assembly expense and requires additional space within the limited confines of a watch case.

Figures 2, 3, 4, 5:
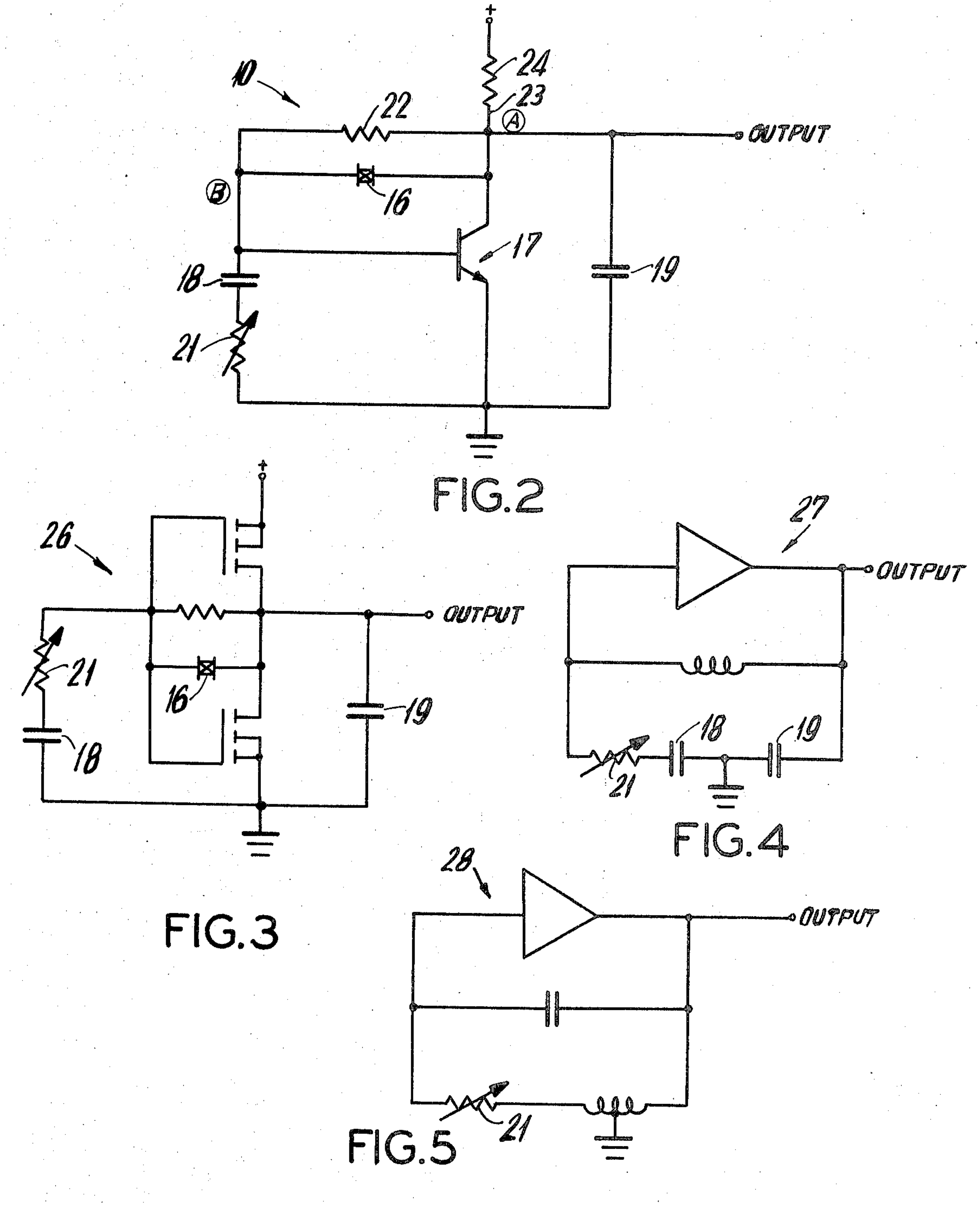
FIG. 2 is a circuit drawings of the quartz oscillator showing the resistor trim arrangement of the present invention in a bipolar Pierce circuit.
FIG. 3 shows the use of the resistor trim arrangement in a complementary MOS oscillator embodiment.
FIG. 4 shows the invention in a modified Colpitts oscillator embodiment.
FIG. 5 shows the invention in the embodiment of a modified Hartley oscillator.

The present invention is illustrated in FIG. 2 of the drawings wherein in a variable resistor 21 is inserted in series with capacitor 18. The operation of the circuit is as previously described except that the feed back voltage is $e\ \phi$ where $\phi$ is determined by the combination of resistor 21 and capacitor 18. This phase shifted signal causes a corresponding change in the oscillating frequency of the system and, thus, a precise adjustment in output frequency may be made by changing the value of resistor 21 rather than varying the capacitance value of components 18 or 19. The variable resistor 21 is a more reliable trimming element which may, as a further advantage, be deposited on a substrate.

The present invention is not limited to bipolar Pierce-type circuits as illustrated in FIG. 2. For example, FIG. 3 shows a complementary MOS equivalent 26 of the bipolar circuit of FIG. 2; FIG. 4 shows a modified Colpitts circuit 27 and FIG. 5 shows a modified Hartley oscillator 28. A variable resistor 21 is included in each of the above embodiments to adjust the frequency by resistive means. Since the operation of these circuits 26, 27, and 28 is well-known, details of their functioning have been omitted. The effect of adding resistor 21 is similar to that described with reference to FIG. 2 and similar advantage accrue. Broadly, speaking, the present invention proposes a means for precisely trimming the output frequency of an oscillator by varying the resistance in a branch of the circuit.

It is to be understood that the above-described arrangements are merely illustrative examples of the application. Numerous other arrangements may be readily devised by those skilled in the art which will embody the principles of the invention and fall within the spirit and scope thereof.

In the claims:

1. A timepiece having time indicating means comprising:

a power supply, an oscillator activated by the power supply to provide high frequency output signals, said oscillator comprising a quartz crystal element connected across a complementary MOS circuit and a tank circuit including two series capacitances with a grounded connection between the two capacitances, and a variable resistor being connected in one of the capacitive branches to vary the output frequency, means for dividing down the output pulses, and means activated by the output pulses to drive the time indicating means.

2. A timepiece in accordance with claim 1 wherein: the frequency setting resistor is temperature sensitive to effect a temperature correction for the quartz oscillator.

* * * * *